(12) United States Patent
Bienert et al.

(10) Patent No.: US 9,298,097 B2
(45) Date of Patent: Mar. 29, 2016

(54) PROJECTION EXPOSURE APPARATUS FOR EUV MICROLITHOGRAPHY AND METHOD FOR MICROLITHOGRAPHIC EXPOSURE

(71) Applicant: Carl Zeiss SMT GmbH, Oberkochen (DE)

(72) Inventors: Marc Bienert, Saarbruecken (DE); Heiko Feldmann, Aalen (DE); Aksel Goehnermeier, Essingen-Lauterburg (DE); Oliver Natt, Aalen (DE); Johannes Ruoff, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 418 days.

(21) Appl. No.: 13/782,390

(22) Filed: Mar. 1, 2013

(65) Prior Publication Data

US 2013/0250265 A1    Sep. 26, 2013

Related U.S. Application Data

(63) Continuation of application No. PCT/EP2011/066104, filed on Sep. 16, 2011.

(60) Provisional application No. 61/388,078, filed on Sep. 30, 2010.

(30) Foreign Application Priority Data

Sep. 30, 2010   (DE) .......................... 10 2010 041746

(51) Int. Cl.
*G03B 27/42* (2006.01)
*G03F 7/20* (2006.01)

(52) U.S. Cl.
CPC ............ *G03F 7/70091* (2013.01); *G03F 7/701* (2013.01); *G03F 7/70425* (2013.01)

(58) Field of Classification Search
CPC . G03F 7/70091; G03F 7/701; G03F 7/70075; G03F 7/70125; G03F 7/702; G03F 7/70058; G03F 7/70108; G03F 7/70141; G03F 7/70258; G03F 7/70158; G03F 7/70083; G03F 7/20; G03F 7/70208; G02B 26/12; G02B 5/3066; G02B 17/0663; G02B 27/0043
See application file for complete search history.

(56) References Cited

U.S. PATENT DOCUMENTS 6,658,084 B2    12/2003  Singer
2006/0109436 A1*  5/2006  Van Der Laan et al. ........ 355/52
(Continued)

FOREIGN PATENT DOCUMENTS

DE    102006059024 A1    6/2008
DE    102008042438 A1    4/2010

OTHER PUBLICATIONS

Proc. of SPIE vol. 6921, 69213J, (2008).

*Primary Examiner* — Mesfin T Asfaw
(74) *Attorney, Agent, or Firm* — Fish & Richardson P.C.

(57) ABSTRACT

The disclosure relates to a projection exposure apparatus for EUV microlithography which includes an illumination system for illuminating a pattern, and a projection objective for imaging the pattern onto a light-sensitive substrate. The projection objective has a pupil plane with an obscuration. The illumination system generates light with an angular distribution having an illumination pole which extends over a range of polar angles and a range of azimuth angles and within which the light intensity is greater than an illumination pole minimum value. From the illumination pole toward large polar angles a dark zone is excluded within which the light intensity is less than the illumination pole minimum value, and which has in regions a form corresponding to the form of the obscuration of the pupil plane.

24 Claims, 10 Drawing Sheets

(56) References Cited

U.S. PATENT DOCUMENTS

| | | |
|---|---|---|
| 2006/0232867 A1 | 10/2006 | Mann |
| 2006/0256313 A1 | 11/2006 | Renner et al. |
| 2009/0214984 A1 | 8/2009 | Ling et al. |
| 2009/0251677 A1 | 10/2009 | Endres |
| 2009/0280437 A1* | 11/2009 | Graeupner .................. 430/322 |
| 2011/0200946 A1 | 8/2011 | Mann et al. |

* cited by examiner 22 nm　　30 nm　　36 nm 22 nm　　30 nm　　36 nm 22 nm   30 nm   36 nm

PROJECTION EXPOSURE APPARATUS FOR EUV MICROLITHOGRAPHY AND METHOD FOR MICROLITHOGRAPHIC EXPOSURE

CROSS-REFERENCE TO RELATED APPLICATIONS

This application is a continuation of, and claims priority under 35 U.S.C. §120 to, International Patent Application Serial Number PCT/EP2011/066104, filed Sep. 16, 2011. International Patent Application Serial Number PCT/EP2011/066104 claims priority under 35 U.S.C. §119(e) to U.S. Patent Application Ser. No. 61/388,078, filed Sep. 30, 2010, and also claims benefit under 35 U.S.C. §119 of German Patent Application No. 10 2010 041746.7, filed on Sep. 30, 2010. The entire disclosure of each of these patent applications is incorporated by reference in the present application.

FIELD

The disclosure relates to a projection exposure apparatus for EUV microlithography. Moreover, the disclosure relates to a method for the microlithographic exposure of a light-sensitive substrate, and to a diaphragm of an illumination system of a projection exposure apparatus.

BACKGROUND

A projection exposure apparatus for EUV microlithography is designed for an operating wavelength in the extreme ultraviolet and thus below approximately 100 nm. In particular, the operating wavelength can be 13.5 nm or 7 nm. Depending on the availability of light sources and imaging optical elements, however, it is also possible to use other operating wavelengths.

A projection exposure apparatus of this type usually has an illumination system and a projection objective. The illumination system is used to generate a desired light distribution for illuminating a pattern of a mask or a reticle. The projection objective is used to image the illuminated pattern onto a light-sensitive material with extremely high resolution and thereby to expose the light-sensitive material with the pattern in a structured manner. On the basis of the pattern exposed into the light-sensitive material, real structures can be produced in a semiconductor material, for example, by subsequent work steps.

In order to obtain a high resolution, the projection objective should have a high numerical aperture. Since a projection objective for the EUV range has mirrors as imaging optical elements, it is relatively difficult to realize a high numerical aperture. One option is to provide an (in particular central) obscuration of a pupil plane of the projection objective. As a result, it is possible, for example, to lead the imaging beam path through a perforation in one or in a plurality of imaging optical elements. However, the obscuration can cause problems because only a partial region of the pupil plane contributes to imaging.

SUMMARY

The disclosure seeks to reduce issues caused by an obscuration of a pupil plane. The disclosure provides a corresponding projection exposure apparatus, method for microlithographic exposure, and diaphragm.

The projection exposure apparatus for EUV micro lithography according to the disclosure has an illumination system for illuminating a pattern and a projection objective for imaging the pattern onto a light-sensitive substrate. The projection objective has a pupil plane with an obscuration. The illumination system generates light with an angular distribution having an illumination pole which extends over a range of polar angles and a range of azimuth angles and within which the light intensity is greater than an illumination pole minimum value. From the illumination pole toward large polar angles a dark zone is excluded within which the light intensity is less than the illumination pole minimum value, and which has in regions a form corresponding to the form of the obscuration of the pupil plane. In particular, the dark zone can have the form of an arc of a circle.

The polar angles are defined as the angles of the light rays generated by the illumination system relative to the direction from which the pattern is illuminated, i.e. relative to the average propagation direction of the light generated by the illumination system. In general, this direction does not run perpendicular to the object plane. The azimuth angles in each case specify the circumferential position of the light rays generated by the illumination system on a circle around the aforementioned direction.

The projection exposure apparatus according to the disclosure has the advantage that it makes it possible to expose the substrate with a high contrast ratio. In particular, the dark zone reduces the total power of the light which is diffracted into the obscuration by the pattern and which ultimately does not contribute to the image generation, but rather only to increasing the background and thus to reducing the contrast. This applies especially to diffracting structures of the pattern for which, under the given imaging conditions, at least one diffraction order overlaps the obscuration.

The dark zone can be enclosed in regions by the illumination pole. This means that the dark zone can be formed within the illumination pole in regions. Likewise, it is also possible for the dark zone to be enclosed completely by the illumination pole. In this case, the dark zone would be formed completely within the illumination pole.

The illumination pole can be embodied in concave fashion toward large polar angles at least within an azimuth angle range. This has the advantage that even in the case of diffracting structures of the pattern in which at least one diffraction order overlaps the obscuration, in general for this diffraction order, too, there is still light intensity present laterally alongside the obscuration, which makes a contribution to the image generation.

The outer contour of the dark zone can correspond to the outer contour of the obscuration at least in regions. In particular, the outer contour of the dark zone can correspond at least to a partial region of the outer contour of the obscuration which extends over an azimuth angle range of 90°. Furthermore, the dark zone can be embodied such that its outer contour can be brought to congruence with the outer contour of the obscuration at least in regions by a displacement operation in the pupil plane in particular in a radial direction. In this way, it is possible to obtain a favorable ratio between the light power contained in total in the illumination pole and the light power contributing to the image generation. In this case, the light power contained in the illumination pole is understood to mean the light intensity integrated over the illumination pole.

The disclosure furthermore relates to a projection exposure apparatus for EUV microlithography including an illumination system for illuminating a pattern and a projection objective for imaging the pattern onto a light-sensitive substrate. The projection objective has a pupil plane with an obscuration. The illumination system generates light with an angular distribution having an outer illumination pole which extends over a range of polar angles and a range of azimuth angles and within which the light intensity is greater than an outer illumination pole minimum value. Furthermore, the angular distribution has an inner illumination pole which extends over a range of polar angles and a range of azimuth angles and within which the light intensity is greater than an inner illumination pole minimum value. The angular range of the inner illumination pole has smaller polar angles than the angular range of the outer illumination pole. Moreover, the inner illumination pole minimum value of the light intensity is greater than the outer illumination pole minimum value.

Such an embodiment of the projection exposure apparatus has the advantage that there is still sufficient light intensity available for image generation even when at least one diffraction order attributed to the outer illumination pole overlaps the obscuration.

The angular distribution of the light between the outer illumination pole and the inner illumination pole can have a range of polar angles within which the light intensity is less than the outer illumination pole minimum value and less than the inner illumination pole minimum value. This means that the outer illumination pole and the inner illumination pole can be separated from one another.

The outer illumination pole can have a larger area than the inner illumination pole. As a result, the difference in the light intensity of the outer illumination pole and of the inner illumination pole can be at least partly compensated for. In particular, the outer illumination pole and the inner illumination pole each have the same light power. This condition is considered to be met when the deviation between the light power of the outer illumination pole and the light power of the inner illumination pole is not greater than 10%.

Furthermore, the outer illumination pole and the inner illumination pole can extend over the same range of azimuth angles. This has the advantage that effects which are dependent on the azimuth angle of the illumination of the pattern arise in the same way for the outer illumination pole and for the inner illumination pole.

The disclosure additionally relates to a projection exposure apparatus for EUV microlithography comprising an illumination system for illuminating a pattern and a projection objective for imaging the pattern onto a light-sensitive substrate. The projection objective has a pupil plane with an obscuration. The illumination system generates light with an angular distribution having an illumination pole which extends over a range of polar angles and a range of azimuth angles and within which the light intensity is greater than an illumination pole minimum value. The light intensity increases within the illumination pole from large polar angles toward small polar angles.

In particular, the light intensity can increase continuously.

The illumination pole can extend toward small polar angles to such an extent that polar angles with sine values of less than 110% of the sine values of the polar angles at the edge of the obscuration occur. This has the advantage that upon the imaging of patterns with diffracting structures which have a large period, enough light intensity is available for the image generation. In particular, the illumination pole can extend toward small polar angles as far as the obscuration.

The illumination pole can extend toward large polar angles to such an extent that polar angles with sine values of at least 90% of the object-side numerical aperture of the projection objective occur. This has the advantage that, upon the imaging of patterns with diffracting structures having a small period, enough light intensity is available for the image generation. In particular, the illumination pole can extend toward polar angles whose sine values correspond to the object-side numerical aperture of the projection objective.

The illumination pole can be formed by a mirror arrangement. This enables an almost lossless conversion of a predetermined angular distribution of the light into the angular distribution in accordance with the illumination pole.

Likewise, however, it is also possible to form the illumination pole with the aid of a diaphragm. In this way, the illumination pole can be formed very precisely in accordance with a predetermination with comparatively little outlay.

The illumination pole can extend over a range of azimuth angles which amounts to at least 45°. In particular, the range of azimuth angles can amount to 60°.

The angular distribution of the light can have a further illumination pole, which is embodied analogously to the illumination pole. In particular, the illumination pole and the further illumination pole can lie opposite one another on both sides of the obscuration. In this case, a dipole setting can be formed by the illumination pole and the further illumination pole.

The obscuration can be arranged centrally in the pupil plane. Such an embodiment of the obscuration has advantages with regard to imaging. By way of example, telecentricity errors can thereby be avoided.

The projection objective can have an image-side numerical aperture of at least 0.4. A high numerical aperture has the advantage that a high resolution can be obtained.

In all variants of the disclosure, the illumination pole can be composed of a multiplicity of discrete surface elements which are arranged alongside one another in accordance with a grid. In this case, the light intensity between the discrete surface elements can be lower than that within the discrete surface elements. In particular, there is also the possibility of the light intensity between the discrete surface elements decreasing to zero. In the case of an illumination pole embodied in this way, the intensity within the discrete surface elements is used in each case for the comparison with the minimum values of the light intensity that are mentioned in the claims.

The illumination pole then ends in each case where no discrete surface elements with sufficient intensity follow within a distance defined by the grid of the surface elements.

Moreover, the disclosure relates to a method for the microlithographic exposure of a light-sensitive substrate using a projection objective having a pupil plane with an obscuration.

In the method according to the disclosure, an illumination system is used to generate light in the EUV range with an angular distribution having an illumination pole which extends over a range of polar angles and a range of azimuth angles and within which the light intensity is greater than an illumination pole minimum value. In this case, the illumination pole is embodied such that, toward large polar angles, a dark zone is excluded within which the light intensity is less than the illumination pole minimum value, and which has in regions a form corresponding to the form of the obscuration of the pupil plane.

In one variant of the method according to the disclosure, an illumination system is used to generate light in the EUV range with an angular distribution, which angular distribution has an outer illumination pole which extends over a range of polar angles and a range of azimuth angles and within which the light intensity is greater than an outer illumination pole minimum value. Furthermore, the angular distribution has an inner illumination pole which extends over a range of polar angles and a range of azimuth angles and within which the light intensity is greater than an inner illumination pole minimum value. The angular range of the inner illumination pole has smaller polar angles than the angular range of the outer illumination pole, and the inner illumination pole minimum value of the light intensity is greater than the outer illumination pole minimum value.

In a further variant of the method according to the disclosure, an illumination system is used to generate light in the EUV range with an angular distribution having an illumination pole which extends over a range of polar angles and a range of azimuth angles and within which the light intensity is greater than an illumination pole minimum value. In this case, the illumination pole is embodied such that the light intensity within the illumination pole increases from large polar angles toward small polar angles.

Furthermore, the disclosure relates to a diaphragm of an illumination system of a projection exposure apparatus for EUV micro lithography.

The diaphragm according to the disclosure has at least one diaphragm opening which predetermines the angular distribution of the light which is generated by the illumination system and fed to a projection objective having a pupil plane with an obscuration. The diaphragm opening is delimited by at least one boundary having in regions a form corresponding to the form of the outer contour of the obscuration of the pupil plane of the projection objective. In particular, the boundary can be embodied such that in regions it is identical to the outer contour of the obscuration.

A region of the boundary of the diaphragm opening whose form corresponds to the form of the outer contour of the obscuration of the pupil plane of the projection objective can delimit the diaphragm opening radially toward the outside.

In one variant of the diaphragm according to the disclosure, the latter has at least one inner diaphragm opening and at least one outer diaphragm opening, which predetermine the angular distribution of the light which is generated by the illumination system and fed to a projection objective having a pupil plane with an obscuration. The outer diaphragm opening is arranged completely radially outside the inner diaphragm opening.

The inner diaphragm opening can be delimited by at least one boundary having in regions a form corresponding to the form of the outer contour of the obscuration of the pupil plane of the projection objective. In particular, the boundary can be embodied such that in regions it is identical to the outer contour of the obscuration.

BRIEF DESCRIPTION OF THE FIGURES

The disclosure is explained in greater detail below on the basis of the exemplary embodiments illustrated in the drawings, in which.

DETAILED DESCRIPTION

Figure 1:
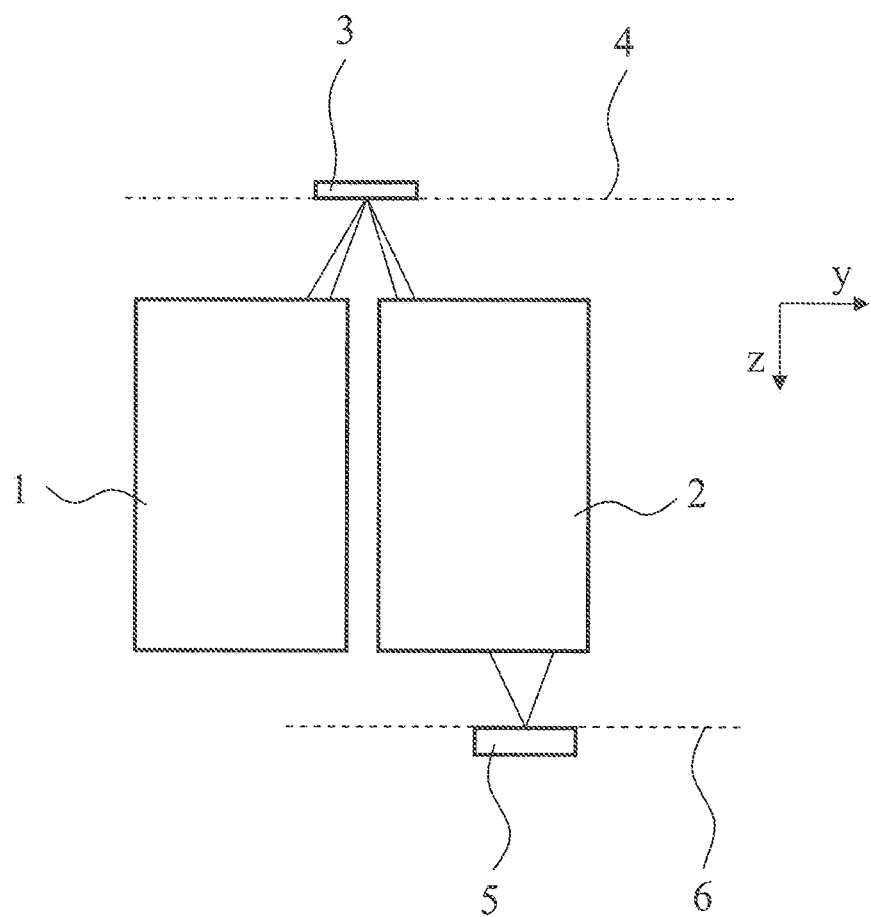
FIG. 1 shows an exemplary embodiment of a projection exposure apparatus for microlithography embodied according to the disclosure, in a schematic block illustration.

FIG. 1 shows an exemplary embodiment of a projection exposure apparatus for microlithography embodied according to the disclosure, in a schematic block illustration.

The projection exposure apparatus includes an illumination system 1 and a projection objective 2. The construction of the illumination system 1 and the construction of the projection objective 2 are explained in greater detail with reference to FIGS. 2 and 3. The illumination system 1 irradiates a mask 3, which is also designated as a reticle, with light having a predeterminable angular distribution. This angular distribution of the light, also designated as illumination setting, is described in even greater detail below. The mask 3 is arranged in an object plane 4 of the projection objective 2 and has a pattern on its side facing the projection objective 2. The projection objective 2 images the pattern of the mask 3 onto a light-sensitive layer of a substrate 5. The substrate 5 is arranged in an image plane 6 of the projection objective 2. The imaging of the pattern of the mask 3 onto the light-sensitive layer of the substrate 5 can be effected, in particular, in the context of a scanning operation in which the mask 3 and the substrate 5 are moved synchronously, taking into consideration the imaging properties of the projection objective 2, and only a partial region of the pattern to be imaged is illuminated parallel to the direction of movement of the mask 3. In order to enable a synchronous movement with respect to the imaging, during the advancing movements of the mask 3 and of the substrate 5 consideration is given to the imaging scale with which the pattern is imaged and whether the imaging is effected in an upright or inverted fashion. The advancing movements of the mask 3 and of the substrate 5 are effected parallel or antiparallel to the y-direction depicted in FIG. 1. The z-direction runs perpendicular to the object plane 4 and to the image plane 6.

Figure 2:
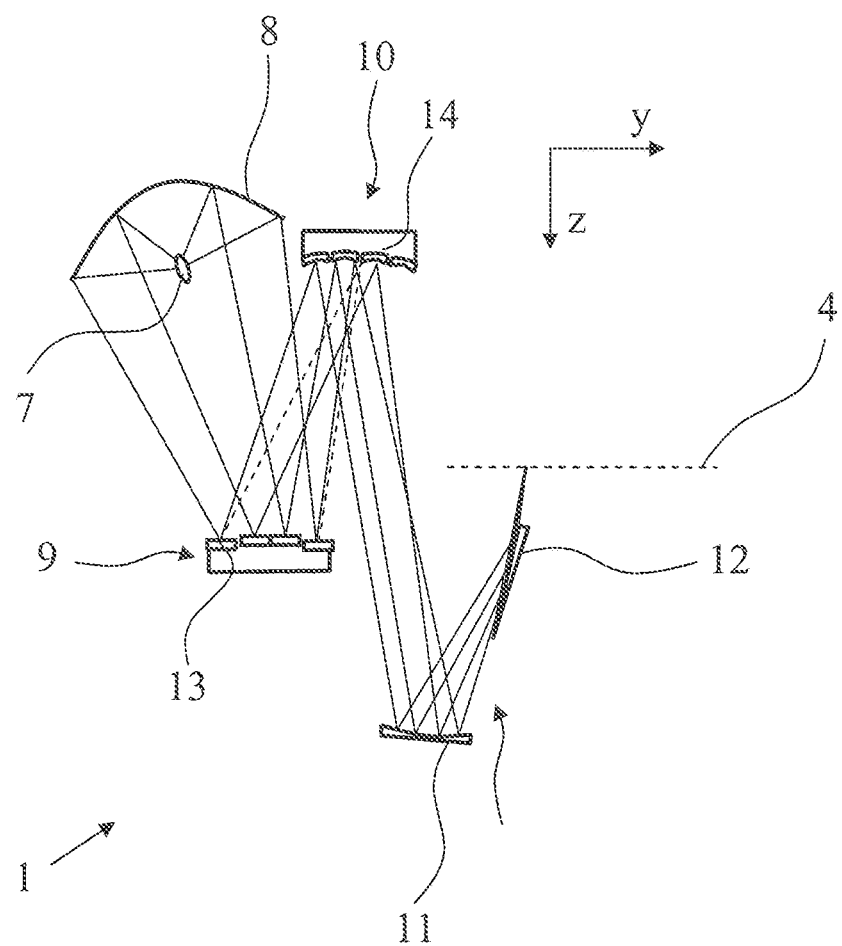
FIG. 2 shows a meridional section of an exemplary embodiment for the illumination system.

FIG. 2 shows a meridional section of an exemplary embodiment for the illumination system 1.

The illumination system 1 has a light source 7, for generating light in the EUV range, that is to say with a wavelength of less than approximately 100 nm. The wavelength of the light generated by the light source 7 is coordinated with the operating wavelength of the projection objective 2 and is, in particular, 13.5 nm or 7 nm. By way of example, a plasma source or a synchrotron can be used as the light source 7.

In this order, a first illumination mirror 8, a second illumination mirror 9, a third illumination mirror 10, a fourth illumination mirror 11 and a fifth illumination mirror 12 are arranged successively in the beam path of the light generated by the light source 7.

The first illumination mirror 8 is embodied as a collector mirror, which collects the light generated by the light source 7 and feeds it to the second illumination mirror 9.

The second illumination mirror 9 is embodied as a facet mirror having a plurality of mirror facets 13. The mirror facets 13 are embodied in movable fashion, such that the orientation relative to the impinging light rays can be varied for each individual mirror facet 13. This means that, for each mirror facet 13, the angle of impingement of the light, that is to say the angle between the light rays and the normal to the surface of the respective mirror facet 13, can be set individually and, consequently, the direction in which the light is specularly reflected can also be chosen in each case. In particular, by driving the mirror facets 13 it is possible to define where the light reflected at the respective mirror facet 13 of the second illumination mirror 9 impinges on the third illumination mirror 10.

The third illumination mirror 10, analogously to the second illumination mirror 9, is likewise embodied as a facet mirror and has a plurality of mirror facets 14. The mirror facets 14 of the third illumination mirror 10 can be driven individually in a manner analogous to the mirror facets 13 of the second illumination mirror 9 and the direction of the reflected light can thereby be influenced. Using coordinated driving of the mirror facets 13 of the second illumination mirror 9 and of the mirror facets 14 of the third illumination mirror 10, the angular distribution of the light that is predetermined by the first illumination mirror 8 can thus be converted in a lossless manner or with only few losses into an angular distribution deviating therefrom.

The fourth illumination mirror 11 is irradiated at relatively small angles with respect to the surface normal at the light impingement location and reflects the light coming from the third illumination mirror 10 in the direction of the fifth illumination mirror 12.

The fifth illumination mirror 12 is irradiated with grazing incidence, that is to say at relatively small angles with respect to the mirror surface, and directs the light into the object plane 4 of the projection objective 2.

The illumination mirrors 8, 9, 10, 11 can be embodied for example in each case as a layer stack arranged on a carrier material. The layer stack can be, in particular, a stack of alternating layers composed of silicon and molybdenum. By way of example, glass ceramic, in particular a glass ceramic sold under the trade name Zerodur, is suitable as carrier material. The illumination mirror 12 can have a metal surface, for example, which can be embodied, in particular as a ruthenium layer. Glass ceramic, in particular, is in turn appropriate as carrier material.

Figure 3:
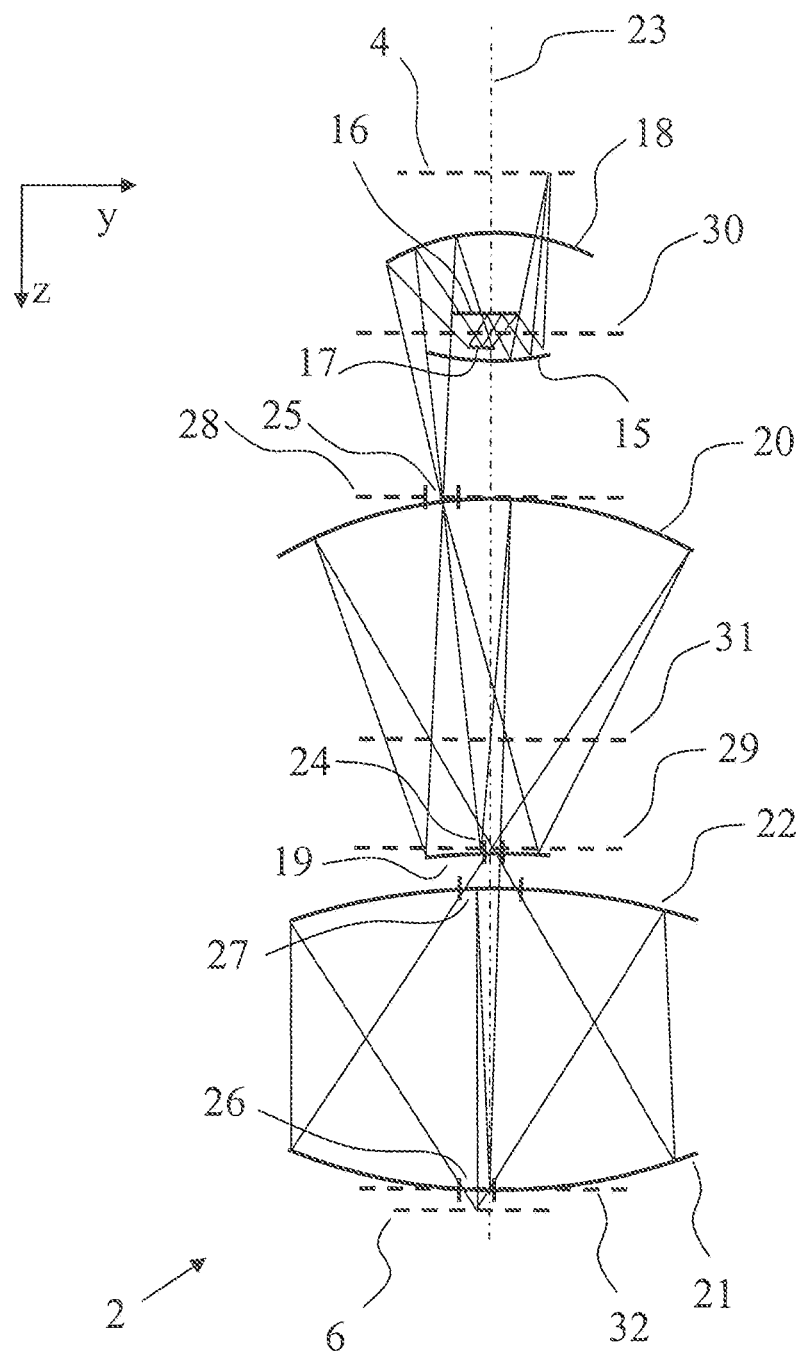
FIG. 3 shows a meridional section of an exemplary embodiment for the projection objective.

FIG. 3 shows a meridional section of an exemplary embodiment for the projection objective 2.

The illustrated exemplary embodiment of the projection objective 2 has a first imaging mirror 15, a second imaging mirror 16, a third imaging mirror 17, a fourth imaging mirror 18, a fifth imaging mirror 19, a sixth imaging mirror 20, a seventh imaging mirror 21 and an eighth imaging mirror 22, which are arranged in this order in the beam path from the object plane 4 to the image plane 6 of the projection objective 2. All of the imaging mirrors 15, 16, 17, 18, 19, 20, 21, 22 can be realized analogously to the illumination mirrors 8, 9, 10, 11, 12 in each case as a layer stack arranged on a carrier material.

In the exemplary embodiment illustrated, all of the imaging mirrors 15, 16, 17, 18, 19, 20, 21, 22 are embodied in aspherical fashion and rotationally symmetrically with respect to an optical system axis 23 of the projection objective 2. However, it is not necessary in each case for the complete solid of revolution of the imaging mirrors 15, 16, 17, 18, 19, 20, 21, 22 actually to be materially present. Rather, it suffices for the imaging mirrors 15, 16, 17, 18, 19, 20, 21, 22 to be formed actually where the light that contributes to the exposure of the light-sensitive material of the substrate 5 impinges on the imaging mirrors 15, 16, 17, 18, 19, 20, 21, 22. Where shading by the imaging mirrors 15, 16, 17, 18, 19, 20, 21, 22 would occur, the imaging mirrors 15, 16, 17, 18, 19, 20, 21, 22 are in each case cut out. Otherwise, the locations at which the solids of revolution of the imaging mirrors 15, 16, 17, 18, 19, 20, 21, 22 are actually formed and the locations at which they are not are left to production engineering considerations and considerations with regard to as far as possible optimum operation of the projection objective 2. The design of the projection objection 2 as illustrated in FIG. 3 involves, moreover, for the fifth imaging mirror 19 to have a cutout 24, the sixth imaging mirror 20 to have a cutout 25, the seventh imaging mirror 21 to have a cutout 26 and the eighth imaging mirror 22 to have a cutout 27, in order that the light can pass from the object plane 4 to the image plane 6.

In the exemplary embodiment illustrated, the projection objective 2 is designed for an operating wavelength of 13.5 nm and has an image-side numerical aperture NA of 0.54. The imaging scale of the projection objective 2 is 6:1. The basic design data of the imaging mirrors 15, 16, 17, 18, 19, 20, 21, 22 are listed in tables 1 and 2.

TABLE 1

| Surface | Radius of curvature | Distance | Type |
|---|---|---|---|
| 1 | Infinite | 316.480 | Object plane |
| 2 | −375.233 | −77.505 | Reflective |
| 3 | 2976.73 | 51.007 | Reflective |
| 4 | Infinite | 0.000 | Aperture stop |
| 5 | 127.889 | −189.982 | Reflective |
| 6 | 329.839 | 1029.934 | Reflective |
| 7 | 787.6 | −596.052 | Reflective |
| 8 | 735.437 | 1171.383 | Reflective |

TABLE 1-continued

| Surface | Radius of curvature | Distance | Type |
|---|---|---|---|
| 9 | −1195.158 | −512.255 | Reflective |
| 10 | 977.668 | 552.254 | Reflective |
| 11 | Infinite | 0.000 | Image plane |

TABLE 2

| Surface | K | C1 | C2 | C3 |
|---|---|---|---|---|
| 2 | 0 | −3.72335E−09 | −1.17134E−13 | −9.45919E−19 |
| 3 | 0 | −6.42297E−08 | 5.78359E−13 | −1.12102E−17 |
| 5 | 0 | −1.89730E−07 | 1.46577E−11 | −7.35930E−15 |
| 6 | 0 | −6.59877E−10 | −4.46770E−15 | −8.43588E−22 |
| 7 | 0 | 6.80330E−10 | 8.62377E−15 | 7.97025E−20 |
| 8 | 0 | 1.51444E−10 | 4.21253E−16 | 9.86205E−22 |
| 9 | 0 | −9.01450E−11 | 7.43085E−17 | −9.79557E−22 |
| 10 | 0 | −4.33573E−10 | −6.45281E−16 | 1.20541E−22 |

| Surface | C4 | C5 | C6 | C7 |
|---|---|---|---|---|
| 2 | 2.64879E−22 | −1.44452E−26 | 3.02340E−31 | 0.00000E+00 |
| 3 | 1.41033E−20 | −2.65285E−24 | 1.76103E−28 | 8.50988E−33 |
| 5 | 4.29136E−18 | 4.55565E−22 | 6.01716E−23 | −9.67457E−26 |
| 6 | −1.47803E−24 | 4.37901E−29 | −7.78139E−34 | 6.26619E−39 |
| 7 | 9.90660E−24 | −3.49519E−27 | 2.27576E−31 | −5.30361E−36 |
| 8 | 2.49255E−27 | 3.14626E−33 | 1.55856E−38 | 5.58485E−45 |
| 9 | 6.90221E−27 | −3.91894E−32 | 1.37730E−37 | −2.19834E−43 |
| 10 | 6.77194E−28 | 1.92112E−32 | −7.82371E−38 | 1.09694E−43 |

In tables 1 and 2, the surfaces are in each case designated in the first column. The further columns in table 1 present the radius of curvature of the best matching sphere, the distance on the optical system axis 23 to the next surface, and an indication of what type of surface is involved in each case. In table 2, the aspherical constants K, C1, C2, C3, C4, C5, C6 and C7 of the mirror surfaces are specified in the further columns. On the basis of the aspherical constants, the aspherical mirror surfaces are defined as follows:

$$p(h) = [((1/r)h^2)/(1+\text{SQRT}(1-(1+K)(1/r)^2 h^2))] + C1*h^4 + C2*h^6 + C3*h^8 + C4*h^{10} + C5*h^{12} + C6*h^{14} + C7*h^{16}$$

In this case, the reciprocal (1/r) of the radius of curvature specifies the surface curvature of the respective mirror surface, and h specifies the distance between a surface point and the optical system axis 23 (that is to say the ray height). Consequently, p(h) specifies the so-called sagitta, that is to say the distance between the surface point and the surface vertex in the z-direction.

The projection objective 2 can also be modified such that one or more of the imaging mirrors 15, 16, 17, 18, 19, 20, 21, 22 is or are embodied in spherical fashion. In accordance with a further modification, it is also possible for one or more of the imaging mirrors 15, 16, 17, 18, 19, 20, 21, 22 of the projection objective 2 to be embodied as a freeform surface having no rotational symmetry.

As is evident from the beam path depicted in FIG. 3, the object plane 4 of the projection objective 2 is firstly imaged into a first intermediate image plane 28. The first intermediate image plane 28 is imaged into a second intermediate image plane 29 and the latter in turn into the image plane 6 of the projection objective 2. A first pupil plane 30 is formed between the object plane 4 and the first intermediate image plane 28. A second pupil plane 31 is formed between the first intermediate image plane 28 and the second intermediate image plane 29, and a third pupil plane 32 is formed between the second intermediate image plane 29 and the image plane 6. In the region of the first pupil plane 30, the second pupil plane 31 and the third pupil plane 32, the chief rays in each case intersect the optical system axis 23. The chief rays here are in each case the central rays of the beams which emerge from points of the object plane 4 outside the optical system axis 23. This definition is used independently of whether light is actually present in the region of the chief rays, which is in turn dependent on the illumination setting and the structure of the mask 3. A chief ray is depicted in a representation fashion in FIG. 3. In this case, it should be taken into account that, for reasons of clarity, the chief ray is in part also illustrated in regions in which it is not physically present, e.g. owing to shading effects or on account of obscurations. Moreover, it should be taken into account that the chief ray does not leave the object plane 4 parallel to the optical system axis 23 and, consequently, no telecentricity is present on the object side. This is owing to the fact that the light of the illumination system 1 does not impinge perpendicularly on the mask 3 arranged in the object plane 4, but rather forms an angle different than zero with the normal to the surface of the mask 3. The angular indications here relate in each case to the average direction of propagation of the light beams impinging on the mask 3. On account of the optical aberrations of the projection objective 2, the intermediate images and also the pupils are in each case not formed in a perfectly plane fashion, and so the intermediate images in each case do not lie exactly in the intermediate image planes 28, 29.

The third imaging mirror 17, on account of its relatively small dimensions, acts as an aperture stop and accordingly defines the object-side and the image-side numerical aperture of the projection objective 2. The cutouts 24, 26, 27 in the imaging mirrors 19, 21, 22 have the consequence that the polar angle spectrum of the light in the image plane 6 experiences a further delimitation in addition to the delimitation by the aperture stop. However, the further delimitation is not effected toward large polar angles, but rather toward small polar angles. This means that, in the pupil planes 30, 31, 32 of the projection objective 2, in each case at most a region delimited by the aperture stop can be illuminated and the illuminatable regions of the pupil planes 30, 31, 32 in each case additionally have a central obscuration. The effects of the obscuration on the imaging properties of the projection objective 2 are described below and measures enabling these effects to be reduced are proposed below.

Figure 4:
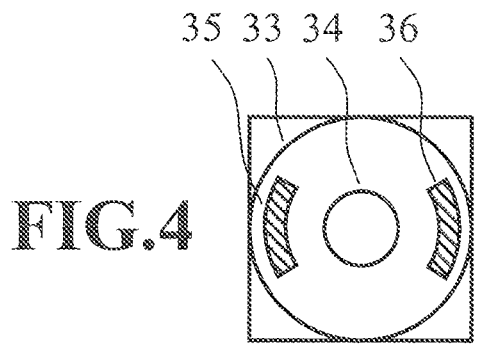
FIG. 4 shows a schematic illustration of an exemplary embodiment of an illumination setting.

FIG. 4 shows a schematic illustration of an exemplary embodiment of an illumination setting.

As already mentioned, the term illumination setting denotes the angular distribution of the light with which the mask 3 is illuminated. This means that the illumination setting corresponds to the angular distribution of the light in the object plane 4 of the projection objective 2 if no diffracting structures are present. Since the angular distribution in the object plane 4 can vary with the spatial coordinate, the form of the illumination setting at the location of the optical system axis 23 is usually specified.

An outer circle 33 illustrates in each case the object-side numerical aperture of the projection objective 2. The coordinates within this outer circle 33 are chosen such that the distance from any point to the midpoint of the outer circle 33 corresponds in each case to the sine of the associated polar angle in the object plane 4 of the projection objective 2. The polar angle is determined here in each case relatively to the direction from which the mask 3 arranged in the object plane 4 is illuminated with the light of the illumination system 1, that is to say relative to the average direction of propagation of the light generated by the illumination system 1. The sine values are normalized here in each case to the object-side numerical aperture of the projection objective 2, such that the outer circle 33 has the radius 1.0. The normalized sine values are designated as values and can vary between 0.0 and 1.0.

An inner circle 34 represents the obscuration of the projection objective 2, that is to say that light rays which are diffracted into the angular range of the obscuration cannot contribute to the generation of an image of the pattern of the mask 3.

Furthermore, FIG. 4 illustrates two illumination poles 35, 36, wherein each illumination pole 35, 36 has an aperture angle of 60° and accordingly extends over a range of azimuth angles which amounts to 60°. Radially, each illumination pole 35, 36 extends over a range from σ=0.6 to σ=0.8. Accordingly, the illumination setting illustrated in FIG. 4 is a dipole setting. Within the illumination poles 35, 36, the light intensity is greater than a predetermined illumination pole minimum value. Outside the illumination poles 35, 36, the light intensity is less than the illumination pole minimum value.

Figure 5:
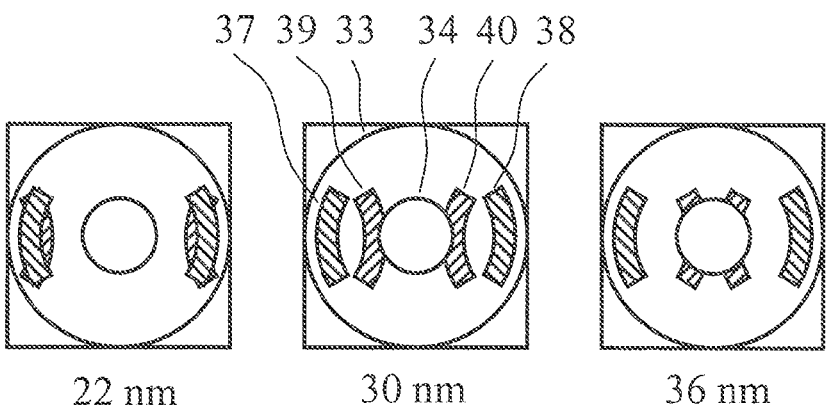
FIG. 5 shows a schematic illustration of the illumination of the first pupil plane of the projection objective during the imaging of different patterns which are illuminated in each case with the illumination setting from FIG. 4.

FIG. 5 shows a schematic illustration of the illumination of the first pupil plane 30 of the projection objective 2 during the imaging of different patterns which are in each case illuminated with the illumination setting from FIG. 4. The angular distribution of the light which is generated by the illumination system 1 and with which the patterns are illuminated is therefore identical for all of the patterns and corresponds to the dipole setting illustrated in FIG. 4.

The patterns in each case have diffracting structures in the form of strips arranged periodically, wherein the strip distance, which hereinafter is also designated as the period of the diffracting structures and is measured e.g. from strip center to strip center, is 22 nm in the left-hand diagram in FIG. 5, 30 nm in the middle diagram in FIGS. 5 and 36 nm in the right-hand diagram in FIG. 5, and the strips run vertically relative to the illustration in FIG. 5. In this case, it should be taken into account that these and also the further indications with regard to the strip distance in each case do not relate to the pattern itself, but rather to the image of the pattern generated in the image plane 6 and, consequently, deviate by the imaging scale from the values which apply to the pattern itself.

Hatching identifies regions of the first pupil plane 30 at which the light intensity exceeds a predetermined illumination minimum value and which are designated hereinafter as illuminated regions 37, 38, 39, 40.

The illuminated regions 37, 38 arise as a result of diffraction of the light at the diffracting structures of the pattern of the mask 3 with $0^{th}$ diffraction order and thus also represent the angular distribution of the light generated by the illumination system 1 in the object plane 4 of the projection objective 2, that is to say the illumination setting. The illuminated regions 39, 40 arise as a result of diffraction of the light at the diffracting structures of the pattern 3 with $1^{st}$ diffraction order, that is to say with $+1^{st}$ diffraction order or $-1^{st}$ diffraction order.

Under the conditions underlined in FIG. 5, in the first pupil plane 30 for each of the two illumination poles 35, 36 a region 37 and 38, respectively, illuminated by the $0^{th}$ diffraction order and a region 39 and 40, respectively, illuminated by the $1^{st}$ diffraction order are formed. The coordinates in FIG. 5 and also in the further figures are chosen here in each case such that the region 37 illuminated by the $0^{th}$ diffraction order and the region 40 illuminated by the $-1^{st}$ diffraction order are formed by the illumination pole 35. The region 38 illuminated by the $0^{th}$ diffraction order and the region 39 illuminated by the $+1^{st}$ diffraction order are formed by the illumination pole 36.

The smaller the period of the diffracting structures of the pattern, the larger in each case the distance between the regions 37, 38 illuminated by the $0^{th}$ diffraction order and the regions 39, 40 illuminated by the associated $1^{st}$ diffraction order. Accordingly, in the left-hand diagram in FIG. 5, in which the diffracting structures of the pattern have the smallest period, the region 40 illuminated by the $-1^{st}$ diffraction order is arranged at the right-hand edge of the outer circle 33 for the object-side numerical aperture of the projection objective 2 and can therefore still just contribute to the image generation in the image plane 6 of the projection objective 2. The region 39 illuminated by the +1st diffraction order is arranged at the left-hand edge of the outer circle 33 for the object-side numerical aperture of the projection objective 2 and can likewise still just contribute to the image generation in the image plane 6 of the projection objective 2. For the image generation in the image plane 6 of the projection objective 2, under the conditions underlined in FIG. 5, the $-1^{st}$ diffraction order can interfere with the $0^{th}$ diffraction order and the $+1^{st}$ diffraction order can interfere with the $0^{th}$ diffraction order. Since all of the illuminated regions 37, 38, 39, 40 in the left-hand diagram in FIG. 5 lie outside the inner circle 34, the obscuration of the first pupil plane 30 has no adverse influence on the image generation.

In the middle diagram in FIG. 5, the diffracting structures of the pattern have a period which is larger than in the left-hand diagram and smaller than in the right-hand diagram. Accordingly, the regions 39, 40 illuminated by the $1^{st}$ diffraction order are in each case shifted toward smaller σ values in a comparison with the left-hand diagram and in regions overlap the inner circle 34 of the obscuration. Therefore, the obscuration of the first pupil plane 30 has the consequence that in each case only a partial zone of the regions 39, 40 illuminated by the $1^{st}$ diffraction order contributes to the image generation and part of the light of the $1^{st}$ diffraction order is lost. The overlap of the regions 39, 40 illuminated by the $1^{st}$ diffraction order with the obscuration has an adverse effect on the image generation over and above the pure intensity losses. The light diffracted into the obscuration is not available as an interference partner for the image generation. Those diffraction orders which involve this light as interference partner, depending on the size of the overlap with the obscuration, can only partly contribute or cannot contribute at all to the image generation and only supply background that reduces the contrast.

In the right-hand diagram in FIG. 5, in which the diffracting structures of the pattern have the largest period, the regions 39, 40 illuminated by the 1$^{st}$ diffraction order are shifted even further toward small σ values and almost completely overlap the inner circle 34 for the obscuration. Consequently, only small partial zones of the regions 39, 40 illuminated by the 1$^{st}$ diffraction order lie outside the obscuration and can contribute to the image generation. Comparatively large partial zones of the regions 39, 40 illuminated by the 1$^{st}$ diffraction order lie within the obscuration and, consequently, are not available as interference partner, such that the background is relatively high and the contrast is relatively low.

Figure 6:
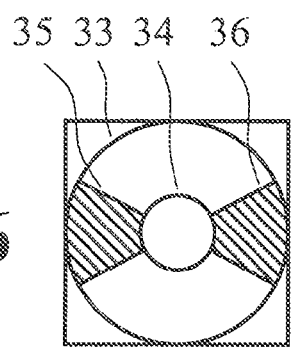
FIG. 6 shows a schematic illustration of a further exemplary embodiment of an illumination setting.

FIG. 6 shows a schematic illustration of a further exemplary embodiment of an illumination setting.

The illumination setting illustrated in FIG. 6 is, analogously to FIG. 4, a dipole setting with illumination poles 35, 36 having an aperture angle of 60°. However, the illumination poles 35, 36 in the dipole setting in FIG. 6 extend radially over a larger range than in FIG. 4, namely from σ=0.3 to σ=1.0. This means that the illumination poles 35, 36 extend radially outward as far as the outer circle 33 for the object-side numerical aperture of the projection objective 2 and radially inward as far as the inner circle 34 for the obscuration.

Figure 7:
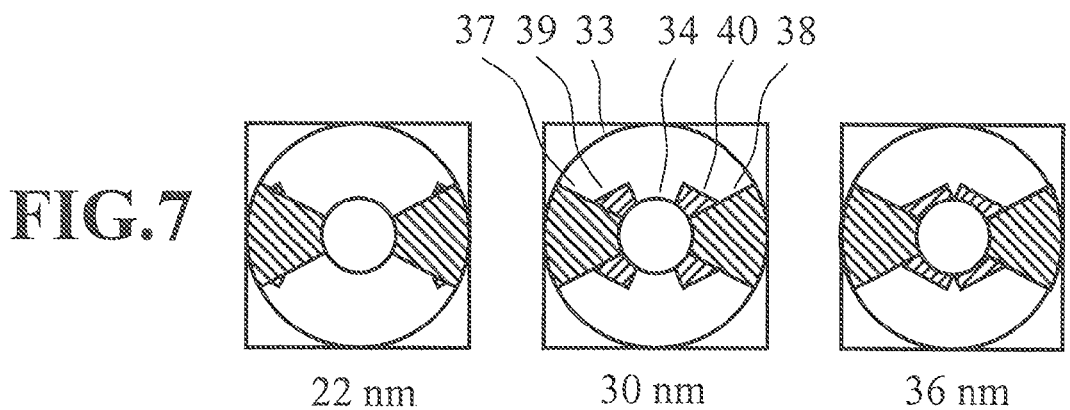
FIG. 7 shows a schematic illustration of the illumination of the first pupil plane of the projection objective during the imaging of different patterns which are illuminated in each case with the illumination setting from FIG. 6.

FIG. 7 shows a schematic illustration of the illumination of the first pupil plane 30 of the projection objective 2 during the imaging of different patterns which are illuminated in each case with the illumination setting from FIG. 6. In each case the same patterns as in FIG. 5 are used here. FIG. 7 also corresponds to FIG. 5 in the manner of illustration.

In the left-hand diagram in FIG. 7, angles outside the object-side numerical aperture of the projection objective 2 occur in the 1$^{st}$ diffraction order, such that only part of the light in the 1$^{st}$ diffraction order contributes to the illumination of the first pupil plane 30. The regions 39, 40 illuminated by the 1$^{st}$ diffraction order accordingly extend as far as the outer circle 33 for the object-side numerical aperture and correspond merely to partial zones of the illumination poles 35, 36 illustrated in FIG. 6.

In the middle diagram in FIG. 7, the regions 39, 40 illuminated by the 1$^{st}$ diffraction order are shifted in each case toward smaller σ values on account of the larger period of the diffracting structures of the pattern, such that the outer circle 33 for the object-side numerical aperture no longer has a limiting effect. However, the regions 39, 40 illuminated by the 1$^{st}$ diffraction order now overlap, analogously to the middle diagram in FIG. 5, the inner circle 34 for the obscuration in regions, such that the obscuration in turn results in a loss of contrast. On account of the larger radial extent of the illumination poles 35, 36 and, consequently, also of the regions 39, 40 illuminated by the 1$^{st}$ diffraction order, however, more light is available as interference partner for image generation than in the case of the middle diagram in FIG. 5.

The same similarly applies to the right-hand diagram in FIG. 7 as well, where the regions 39, 40 illuminated by the 1$^{st}$ diffraction order are shifted toward even smaller σ values on account of the even larger period of the diffracting structures of the pattern. This results in an even larger overlap with the inner circle 34 for the obscuration and accordingly also in an even greater loss of contrast as a result of the obscuration. However, in this case, too, on account of the larger radial extent of the illumination poles 35, 36, more light is available for image generation than in the case of the right-hand diagram in FIG. 5.

Figure 8:
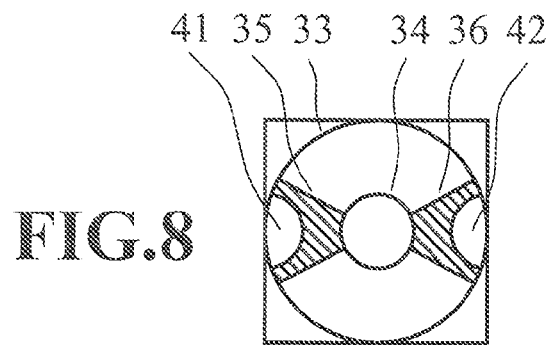
FIG. 8 shows a schematic illustration of a further exemplary embodiment of an illumination setting.

FIG. 8 shows a schematic illustration of a further exemplary embodiment of an illumination setting.

The illumination setting illustrated in FIG. 8 is, analogously to FIGS. 4 and 6, a dipole setting with illumination poles 35, 36 having an aperture angle of 60°. Analogously to FIG. 6, the illumination poles 35, 36 in the dipole setting in FIG. 6 extend radially over a range of σ=0.3 to σ=1.0. However, the illumination poles 35, 36 in FIG. 8 differ from the illumination poles 35, 36 in FIG. 6 by virtue of dark zones 41, 42 within which the light intensity is in each case less than the illumination pole minimum value. The dark zones 41, 42 are formed in the outer regions of the illumination poles 35, 36 and have the form of circle segments. Details concerning the geometry of the illumination poles 35, 36 and in particular of the dark zones 41, 42 are explained with reference to FIG. 10.

Figure 9:
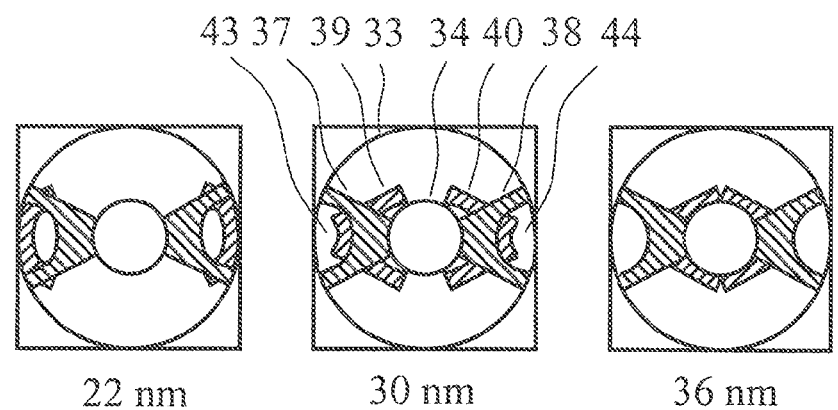
FIG. 9 shows a schematic illustration of the illumination of the first pupil plane of the projection objective during the imaging of different patterns which are illuminated in each case with the illumination setting from FIG. 8.

FIG. 9 shows a schematic illustration of the illumination of the first pupil plane 30 of the projection objective 2 during the imaging of different patterns which are illuminated in each case with the illumination setting from FIG. 8. The same patterns as in FIGS. 5 and 7 are in each case used here. FIG. 9 also corresponds to FIGS. 5 and 7 in the manner of illustration.

The dark zones 41, 42 of the illumination poles 35, 36 of the illumination setting in FIG. 8 have the consequence that the regions 37, 38 illuminated by the 0$^{th}$ diffraction order and the regions 39, 40 illuminated by the 1$^{st}$ diffraction order in FIG. 9 in each case differ by virtue of unilluminated zones 43, 44 having a light intensity below the illumination minimum value from FIG. 7. The geometry of the unilluminated zones 43, 44 corresponds to the geometry of eth dark zones 41, 42.

It is furthermore evident from a comparison of FIGS. 7 and 9 that in the case of the dipole illumination modified in accordance with FIG. 9, in the case of a small period of the diffracting structures of the pattern (left-hand diagram), less light is available for the image generation than in the case of the dipole illumination in accordance with FIG. 7. The regions 37, 38 illuminated by the 0$^{th}$ diffraction order and also the regions 39, 40 illuminated by the 1$^{st}$ diffraction order have a smaller area in the left-hand diagram in FIG. 9 than in the left-hand diagram in FIG. 7. With regard to the loss of contrast as a result of the limited object-side numerical aperture and a result of the obscuration, there is no difference.

In the case of a medium period of the diffracting structures of the pattern (middle diagram), in FIG. 9, in particular the regions 37, 38 illuminated by the 0$^{th}$ diffraction order and to a lesser extent also the regions 39, 40 illuminated by the 1$^{st}$ diffraction order have a smaller area than in FIG. 7. In contrast to FIG. 7, however, in FIG. 9 a loss of contrast as a result of the obscuration does not occur since the regions 39, 40 illuminated by the 1$^{st}$ diffraction order, owing to the unilluminated zones 43, 44, which are formed in the region of the regions 39, 40 illuminated by the 1$^{st}$ diffraction order in a manner analogous to that in the region of the regions 37, 38 illuminated by the 0$^{th}$ diffraction order, do not overlap the inner circle 34 for the obscuration.

In the case of a large period of the diffracting structures of the pattern (right-hand diagram), in FIG. 9, exclusively the regions 37, 38 illuminated by the 0$^{th}$ diffraction order, but not the regions 39, 40 illuminated by the 1$^{st}$ diffraction order, have a smaller area than in FIG. 7. Only a small loss of contrast as a result of the obscuration occurs, since the regions 39, 40 illuminated by the 1$^{st}$ diffraction order, owing to the unilluminated zones 43, 44, only slightly overlap the inner circle 34 for the obscuration.

Figure 10:
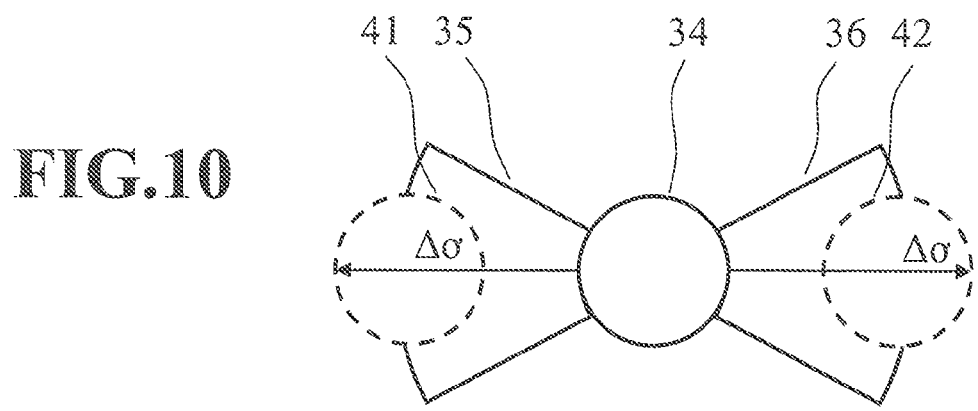
FIG. 10 shows a schematic illustration of the geometry of the illumination poles of the illumination setting used in FIG. 9.

FIG. 10 shows a schematic illustration of the geometry of the illumination poles 35, 36 of the illumination setting used in FIG. 9. FIG. 10 illustrates as a basic form, on the basis of which the illumination poles 35, 36 are designed, the form of the illumination poles 35, 36 from FIG. 7, that is to say that the illumination poles 35, 36 have an aperture angle of 60° and extend between σ=0.3 and σ=1.0. Furthermore, the inner circle 34 for the obscuration is depicted in FIG. 7. Since the light of the illumination poles 35, 36 which is diffracted into the obscuration cannot contribute as interference partner to the image generation, in the context of the disclosure at least part of the light is excluded from the illumination poles 35, 36. Accordingly, the area of the illumination poles 35, 36 is reduced by the dark zones 41, 42.

However, the region of the illumination poles 35, 36 which is diffracted into the obscuration is dependent on the diffracting structures of the pattern. Since the mask 3 generally has a pattern which, in terms of its complexity, goes beyond a simple strip pattern having identical strip distances, it can happen that the same regions of the illumination poles 35, 36 contribute to the image generation for a first diffracting structure of the pattern and are diffracted into the obscuration for a second diffracting structure of the pattern and, consequently, do not contribute to the image generation. Therefore, in the definition of the dark zones 41, 42 depending on the diffracting structures of the pattern, a compromise is involved by virtue of which enough light for image generation is still provided for all the diffracting structures and as little light as possible is diffracted into the obscuration. This compromise can turn out such that the inner circle 34 for the obscuration is in each case shifted laterally by a distance Δu toward both illumination poles 35, 36 and the regions of the shifted inner circle 34 are cut out from the illumination poles 35, 36. The dark zones 41, 42 embodied as circle segments arise in this way. The distance Δσ can be calculated in the following way:

$$\Delta\sigma = \lambda/(P_{critical}NA)$$

In this case, λ is the operating wavelength of the projection objective 2, $P_{critical}$ is a critical period of the diffracting structures of the pattern for which the contrast or a parameter NILS, defined in even greater detail below, has a minimum and NA is the image-side numerical aperture of the projection objective 2.

The quantitative effects of the above-described illumination settings on the contrast that can be achieved during imaging with the projection objective 2 are explained in greater detail below with reference to FIG. 11.

Figure 11:
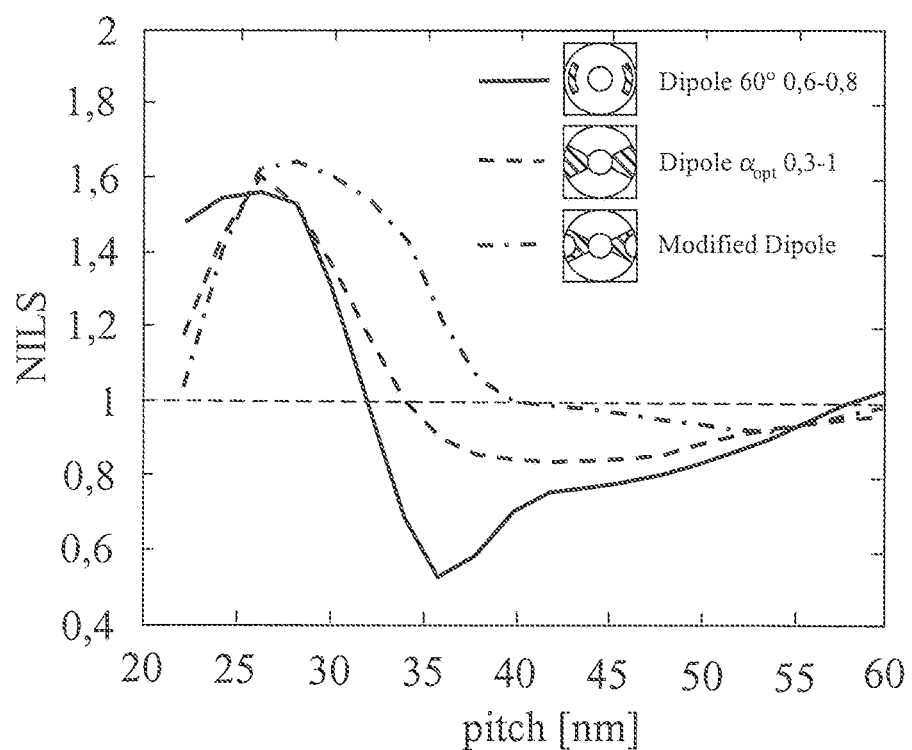
FIG. 11 shows a diagram for illustrating the suitability of different illumination settings for a lithography process.

FIG. 11 shows a diagram for illustrating the suitability of various illumination settings for a lithography process. In the diagram, for various illumination settings, a parameter NILS (Normalized Image Log Slope) for the printability of an image generated with the projection objective 2 is plotted against the period (pitch) of the imaged pattern. Printability is understood here to mean the extent to which the requirements for the exposure of the light-sensitive layer of the substrate 5 arranged in the image plane 6 of the project objective 2 are satisfied with the image generated in each case. The parameter NILS is defined here by way of the gradient of the location-dependent intensity profile for intensity values which correspond to the exposure threshold of the light-sensitive layer of the substrate 5:

$$NILS = \frac{CD}{I} \frac{dI(x)}{dx}\bigg|_{I=exposure threshold}$$

In this case, CD is the width of the intensity profile, which represents a line, for example, at the exposure threshold, I is the intensity and x is a spatial coordinate in the image plane.

Printability of the image is ensured if the parameter NILS has a value of at least 1. For values of the parameter NILS distinctly less than 1, the minimum requirements made of the exposure of the light-sensitive layer of the substrate 5 are not complied with and, consequently, printability is not ensured.

It is evident from FIG. 11 (see curve profile illustrated as a solid line) that, for the dipole setting illustrated in FIG. 4, the parameter NILS assumes values of approximately 0.6 in the case of a period of the diffracting structures of the pattern in the region of 36 nm and printability of this period is therefore not ensured with the illumination setting mentioned. As is apparent from the right-hand diagram in FIG. 5, the low value of the parameter NILS in the case of a period of 36 nm can be attributed to the fact that the regions 39, 40 illuminated by the $1^{st}$ diffraction order greatly overlap the obscuration and a considerable loss of contrast therefore occurs.

A significant improvement can be achieved with the illumination setting illustrated in FIG. 6 (see curve profile illustrated as a dashed line), in the case of which the illumination poles 35, 36 extend over a larger σ range and, consequently, in the case of the period of 36 nm, despite the overlap of the regions 39, 40 illuminated by the $1^{st}$ diffraction order with the obscuration, a relatively large amount of light is still available for the image generation. In the case of this illumination setting, the parameter NILS has values above 0.8 within the entire range illustrated.

Even better printability can be obtained with the modified dipole setting illustrated in FIG. 8, in the case of which the dark zones 41, 42 are excluded from the illumination poles 35, 36 (see curve profile illustrated as a dash-dotted line). This improvement is based on the fact that in the case of the modified dipole setting, owing to the unilluminated zones 43, 44 resulting from the dark zones 41, 42, the overlap with the obscuration is reduced and, accordingly, the loss of contrast also turns out to be smaller. This has the consequence that, in the case of the modified dipole setting in FIG. 8, the value of the parameter NILS in the range illustrated falls only slightly below 1, even though no more light is available for image generation than in the case of the dipole setting corresponding thereto in FIG. 6, which has no dark zones 41, 42. Consequently, sufficient printability is ensured in the case of the modified dipole setting for all illustrated periods of the diffracting structures of the pattern.

Consequently, it can be gathered directly from FIG. 11 that the modified dipole setting in FIG. 8, compared with the dipole settings in FIGS. 4 and 6, ensures the best printability overall. Moreover, for the modified dipole setting in FIG. 8 compared with the dipole settings in FIGS. 4 and 6, the largest process window arises with regard to the exposure latitude and the permissible defocusing. By way of example, for the periods 22 nm, 40 nm, 54 nm and 150 nm in the case of the modified dipole setting in FIG. 8, an exposure latitude of 9.02% and a depth of focus of 32 mm result. With the corresponding dipole setting in FIG. 6 without the dark zones 41, 42, an exposure latitude of 7.83% and a depth of focus of 28 nm are achieved.

As an alternative to the dipole settings described above, differently formed illumination settings can also be used in order to achieve good printability. This is explained in greater detail below with reference to FIGS. 12 to 18.

Figure 12:
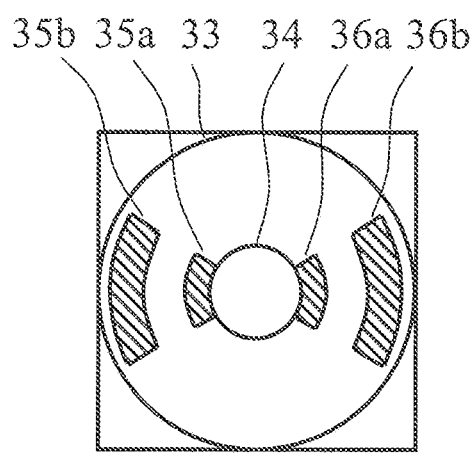
FIG. 12 shows a schematic illustration of a further exemplary embodiment of an illumination setting.

FIG. 12 shows a schematic illustration of a further exemplary embodiment of an illumination setting. The illumination setting illustrated in FIG. 12 has two inner illumination poles 35a, 36a and two outer illumination poles 35b, 36b. Accordingly, this illumination setting is also designated hereinafter as a double dipole setting. Within the inner illumination poles 35a, 36a, the light intensity is greater than a predetermined inner illumination pole minimum value. Within the outer illumination poles 35b, 36b, the light intensity is greater than a predetermined outer illumination pole minimum value. Outside the illumination poles 35a, 35b, 36a, 36b, the light intensity is less than the inner illumination pole minimum value and the outer illumination pole minimum value. The inner illumination poles 35a, 36a and the outer illumination poles 35b, 36b in each case extend over the same range of azimuth angles of 60°, for example, and are in each case arranged in the same circumferential section. The outer illumination poles 35b, 36b are arranged radially outside the inner illumination poles 35a, 36a and accordingly have higher σ values than the inner illumination poles 35a, 36a. Moreover, the illuminated area of the outer illumination poles 35b, 36b is greater than the illuminated area of the inner illumination poles 35a, 36a. By way of example, the illuminated area of the outer illumination poles 35b, 36b can be twice as large as the illuminated area of the inner illumination poles 35a, 36a. However, the inner illumination poles 35a, 36a have a higher light intensity than the outer illumination poles 36b, 36b. By way of example, the light intensity of the inner illumination poles 35a, 36a can be twice as high as the light intensity of the outer illumination poles 35b, 36b. In particular, the illuminated areas and the light intensities of the inner illumination poles 35a, 36a and of the outer illumination poles 35b, 36b can be coordinated with one another such that the inner illumination poles 35a, 36a and the outer illumination poles 35b, 36b each have the same light power. The radial distance between the outer illumination poles 35b, 36b and the inner illumination poles 35a, 36a can be chosen, in particular, such that the $1^{st}$ diffraction orders of the inner illumination poles 35a, 36a, in the case of diffraction at diffracting structures of the pattern with the critical period $P_{critical}$, completely or at least for the most part outside the obscuration. This is illustrated in FIG. 13.

Figure 13:
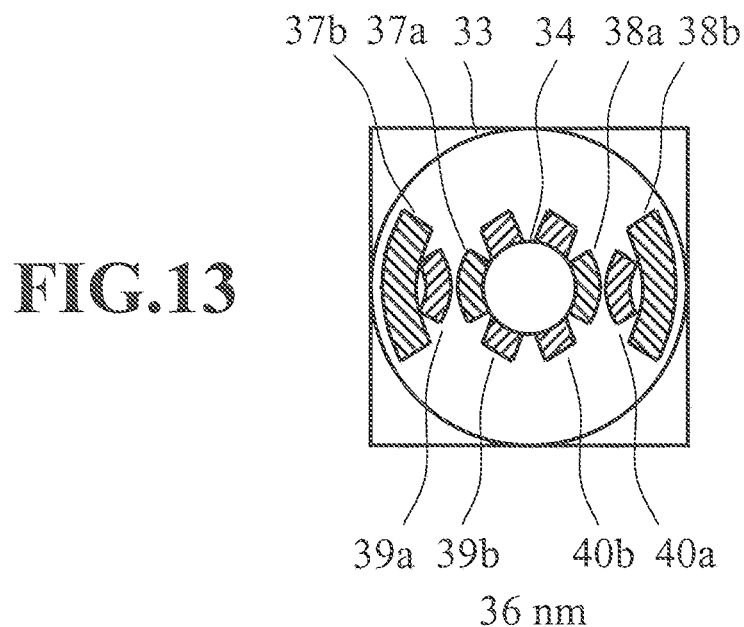
FIG. 13 shows a schematic illustration of the illumination of the first pupil plane of the projection objective during the imaging of a pattern for the illumination setting illustrated in FIG. 12.

FIG. 13 shows a schematic illustration of the illumination of the first pupil plane 30 of the projection objective 2 during the imaging of a pattern for the illumination setting illustrated in FIG. 12. The pattern is a strip pattern, wherein the strip distances correspond to the critical period $P_{critical}$. In the exemplary embodiment illustrated, the critical period $P_{critical}$ has a value of 36 nm.

FIG. 13 illustrates regions 37a, 38a illuminated by the $0^{th}$ diffraction order of the inner illumination poles 35a, 36a, regions 37b, 38b illuminated by the $0^{th}$ diffraction order of the outer illumination poles 35b, 36b, regions 39a, 40a illuminated by the $1^{st}$ diffraction order of the inner illumination poles 35a, 36a, and regions 39b, 40b illuminated by the $1^{st}$ diffraction order of the outer illumination poles 35b, 36b.

As is apparent from FIG. 13, the regions 39b, 40b illuminated by the $1^{st}$ diffraction order of the outer illumination poles 35b, 36b greatly overlap the obscuration, such that a great loss of contrast occurs under the conditions illustrated. However, this loss of contrast can be compensated for at least in part by the inner illumination poles 35a, 36a, since the regions 39a, 40a illuminated by the $1^{st}$ diffraction order of the inner illumination poles 35a, 36a do not overlap the obscuration. In this case, on account of the high light intensity of the inner illumination poles 35a, 36a, in many cases enough light is available for the compensation. The effects of this compensation on the printability of the image are illustrated in FIG. 14.

Figure 14:
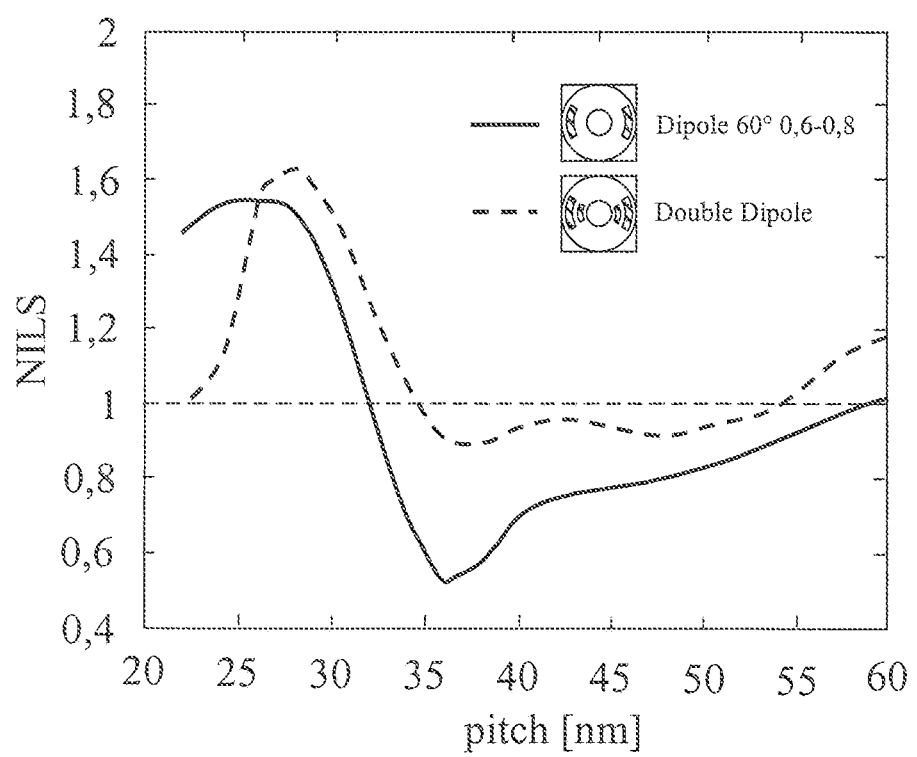
FIG. 14 shows a diagram for illustrating the effect of the inner illumination poles illustrated in FIG. 12 on printability.

FIG. 14 shows a diagram for illustrating the effect of the inner illumination poles 35a, 36a illustrated in FIG. 12 on printability. The manner of illustration corresponds to FIG. 11, that is to say that the parameter NILS for printability is plotted against the period of the imaged pattern.

The illustration shows in the form of a solid line a curved profile which was determined for a dipole setting in which the illumination poles have an aperture angle of 60° and extend radially over a range from σ=0.6 to σ=0.8. This corresponds to the outer illumination poles 35b, 36b in FIG. 12. The curved profile has a great dip in the case of the critical period $P_{critical}$=36 nm, such that the values of the parameter NILS in this region are significantly less than 1 and the printability of the image for diffracting structures of the pattern with a period in the vicinity of the critical period $P_{critical}$ is not ensured.

A further curved profile of the diagram illustrated in FIG. 14 is illustrated in the form of a dashed line. The further curved profile was determined for the double dipole setting illustrated in FIG. 12 with the inner illumination poles 35a, 36a and the outer illumination poles 35b, 36b and also has in the vicinity of the critical period $P_{critical}$=36 nm a value of the parameter NILS of only just less than 1. This means that sufficient printability of the image is ensured in the entire range illustrated.

As an alternative to the double dipole setting illustrated in FIG. 12 with the inner illumination poles 35a, 36a and outer illumination poles 35b, 36b, it is also possible to use a dipole setting with only two illumination poles 35, 36, each having a light intensity that varies in a radial direction. This means that the two illumination poles 35, 36 have a different light intensity in each case at different σ values. In particular, the illumination poles 35, 36 have a higher light intensity at small σ values than at large σ values. In this case, the light intensity can decrease continuously from small σ values to large σ values. Illumination poles 35, 36 that vary in their light intensity in this way can have an aperture angle of 60°, for example, and extend radially over a range from σ=0.3 to σ=1.0.

Generally, the illumination setting can be embodied such that as far as possible all regions which do not contribute to the image generation are removed and/or that additional regions are added in order to compensate for a loss of contrast caused by an overlap of other regions with the obscuration. In order to design a suitable illumination setting, therefore, it can firstly be checked which regions of the first pupil plane 30 of the projection objective 2 contribute to the image generation for one or for a plurality of periods of the diffracting structures of a pattern. The illumination setting can then be optimized in such a way that these regions of the first pupil plane 30 are illuminated as optimally as possible and, at the same time, the other regions of the first pupil plane 30 and in particular the region of the obscuration are illuminated as little as possible. In the case of a pattern having diffracting structures having different periods, it will generally involve to make a compromise which enables sufficient printability of the image for all periods.

Figure 15:
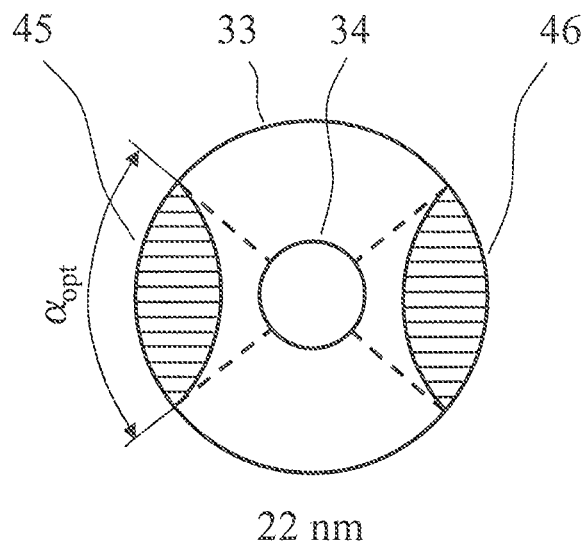
FIG. 15 shows a schematic illustration of the first pupil plane, wherein those regions which contribute to image generation in the case of a period of the diffracting structures of the pattern of 22 nm are identified.
Figure 16:
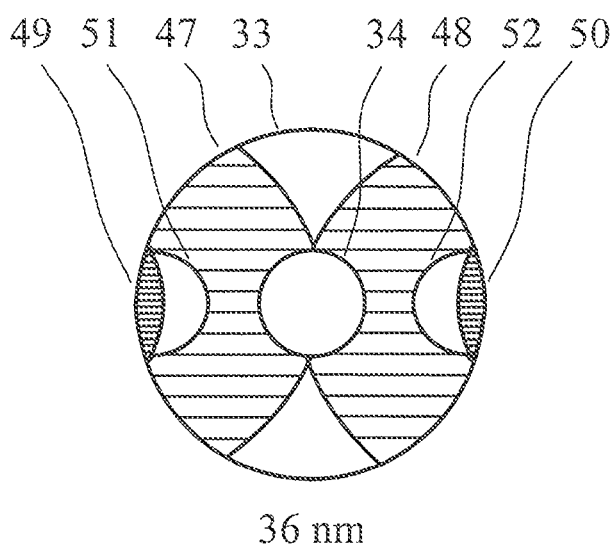
FIG. 16 shows a schematic illustration of the first pupil plane, wherein those regions which contribute to image generation in the case of a period of the diffracting structure of the pattern of 36 nm are identified.
Figure 17:
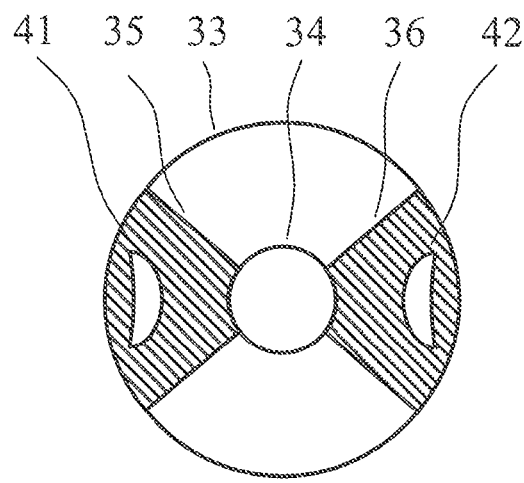
FIG. 17 shows a schematic illustration of an illumination setting designed on the basis of FIGS. 15 and 16.

The procedure in the design of a suitable illumination setting is explained for a concrete example with reference to FIGS. 15 to 17.

FIG. 15 shows a schematic illustration of the first pupil plane 30, wherein those regions which contribute to the image generation in the case of a period of the diffracting structures of the pattern of 22 nm are identified. As can be gathered from FIG. 15, two pupil regions 45 and 46 emphasized by hatching exist from which the light contributes to the image generation. In this case, the image is generated by an interference of the $0^{th}$ and $+1^{st}$ diffraction orders and by an interference of the $0^{th}$ and $-1^{st}$ diffraction orders. The image generation from the $0^{th}$ and $+1^{st}$ diffraction orders is effected using light from the pupil region 45 and the image generation by interference of the $0^{th}$ and $-1^{st}$ diffraction orders is effected using light from the pupil region 46. The light outside the pupil regions 45, 46 does not contribute to the image generation, but rather merely increases the background and thereby impairs the contrast.

The pupil region 45 and the pupil region 46 in each case extend over a range of azimuth angles $\alpha_{opt}$.

FIG. 16 shows a schematic illustration of the first pupil plane 30, wherein those regions which contribute to the image generation in the case of the period of the diffracting structures of the pattern of 36 nm are identified. In the case of a period of 36 nm, under conditions otherwise identical to those in FIG. 15, four pupil regions 47, 48, 49 and 50 contribute to the image generation. The pupil regions 47, 48, 49, 50 are emphasized by hatching. In detail, the image is generated by an interference of the $0^{th}$ and $+1^{st}$ diffraction orders from the pupil region 47, the $0^{th}$ and $-1^{st}$ diffraction orders from the pupil region 48, the $-1^{st}$ and $+1^{st}$ diffraction orders from the pupil region 49, and the $+1^{st}$ and $-1^{st}$ diffraction orders from the pupil region 50. The light outside the pupil regions 47, 48, 49, 50 does not contribute to the image generation. This also applies, in particular, to the light from the pupil regions 51 and 52 which are surrounded by the pupil regions 47 and 49, and, respectively, 48 and 50.

FIG. 17 shows a schematic illustration of an illumination setting designed on the basis of FIGS. 15 and 16. The illumination setting can be designed using an iterative algorithm or geometrically. In order to design the illumination setting, firstly the intersection is formed from the pupil regions 45, 46 which contribute to the image generation in the case of the period of 22 nm and the pupil regions 47, 48, 49, 50 which contribute to the image generation in the case of the period of 36 nm. The intersection is also supplemented by partial zones of the pupil regions 47, 48 which contribute to the image generation only for one of the two periods. As a result, the intention, in particular, is also to ensure sufficient printability in the case of periods other than 22 nm and 36 nm, on which FIGS. 15 and 16 are based. In the case of the exemplary embodiment illustrated, partial zones are added within the range of azimuth angles $\alpha_{opt}$ toward small σ values up to the inner circle 34 for the obscuration. In addition, the dark zones 41, 42 are excluded for taking into consideration the non-contributing pupil regions 51, 52. Overall, this results in two optimized illumination poles 35, 36 each having an aperture angle that corresponds to the range of azimuth angles $\alpha_{opt}$. The optimized illumination poles 35, 36 extend radially between the inner circle 34 for the obscuration and the outer circle 33 for the numerical aperture, wherein the dark zones 41, 42 are excluded. A further optimization can be achieved by variation of the light intensity within the illumination setting. In particular, an intensity gradient can be formed in such a way that the light intensity of the illumination poles 35, 36 increases at least in regions toward small σ values, that is to say radially inward.

Figure 18:
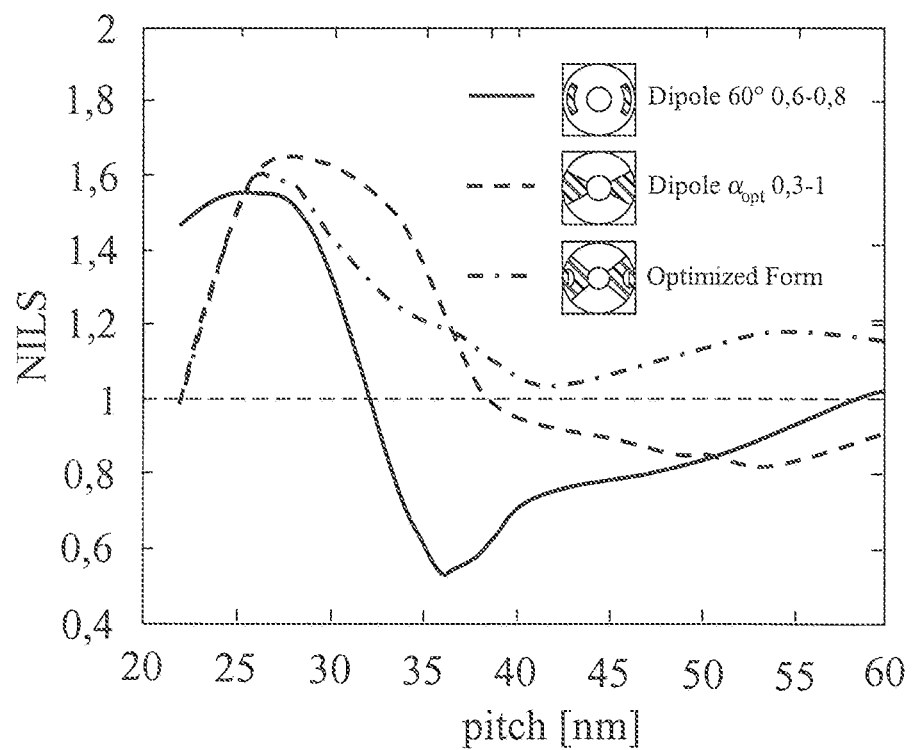
FIG. 18 shows a diagram for illustrating the printability for various illumination settings.

FIG. 18 shows a diagram for illustrating the printability in the case of various illumination settings. The manner of illustration was chosen analogously to FIGS. 11 and 14. In this case, a total of three curved profiles for the parameter NILS are illustrated, each representing a different illumination setting.

The illustration shows as a solid line a curved profile which was determined for the dipole setting in FIG. 4, in which the illumination poles 35, 36 have an aperture angle of 60° and extend radially over a range from σ=0.6 to σ=0.8. The same curved profile is also illustrated in the diagrams in FIGS. 11 and 14 and exhibits a great dip in the parameter NILS at a period of approximately 36 nm. In the region of this period, the parameter NILS falls to values of less than 0.6.

The illustration shows as a dashed line a curved profile which was determined for the dipole setting illustrated in FIG. 17 without the dark zones 41, 42, that is to say in which the illumination poles 35, 36 have an aperture angle which corresponds to the range of azimuth angles $\alpha_{opt}$, and extend radially continuously over a range from σ=0.3 to σ=1.0. This curved profile constitutes a significant improvement over the curved profile illustrated as a solid line and, in particular, no longer exhibits the dip in the parameter NILS at a period of approximately 36 nm. However, in this curved profile, too, the values of the parameter NILS fall below the value 1 in regions. However, the value NILS=0.8 is not undershot.

The illustration shows as a dash-dotted line a curved profile which was determined for the dipole setting illustrated in FIG. 17 having the dark zones 41, 42. This curved profile again constitutes a significant improvement over the curved profile illustrated as a dashed line. The curve progresses above the value NILS=1 in the entire range illustrated. Accordingly, good printability is ensured in the entire range illustrated.

Figure 19:
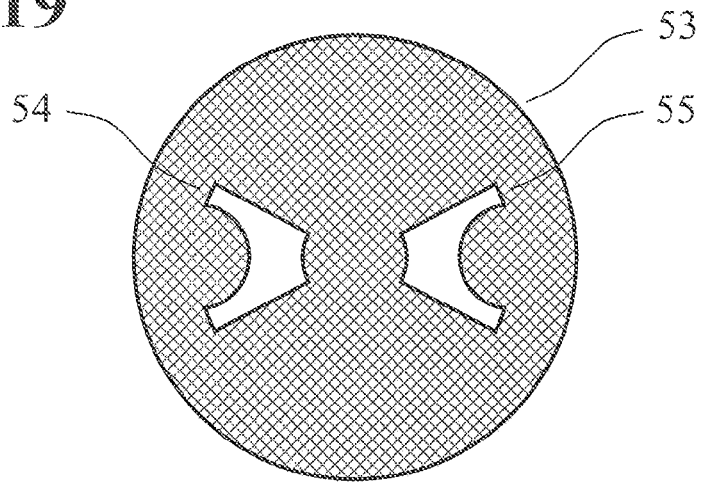
FIG. 19 shows a schematic illustration of an exemplary embodiment of a diaphragm for setting the illumination setting illustrated in FIG. 18.
Figure 20:
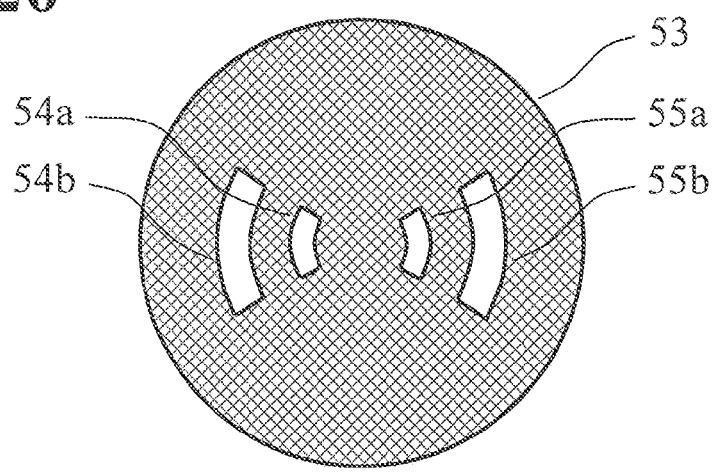
FIG. 20 shows a schematic illustration of an exemplary embodiment of a diaphragm for setting the illumination setting illustrated in FIG. 12.
Figure 21:
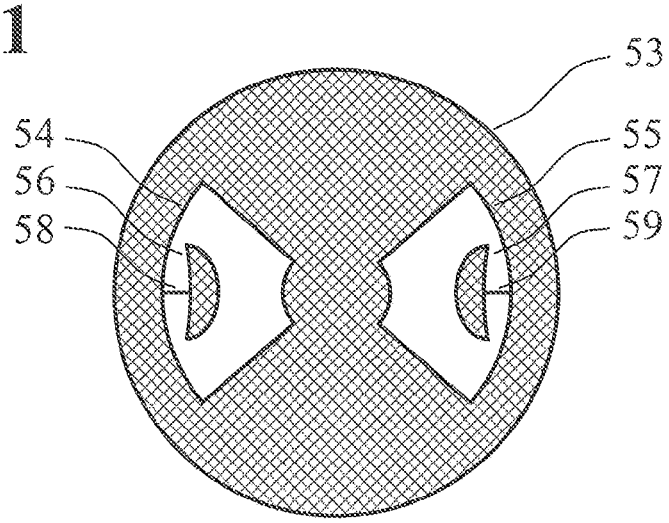
FIG. 21 shows a schematic illustration of an exemplary embodiment of a diaphragm for setting the illumination setting illustrated in FIG. 17.

The illumination setting determined in the manner described above or in some other manner can be set, for example, using one or a plurality of diaphragms which, in particular, can be arranged in a pupil plane of the illumination system (1). Exemplary embodiments of suitable diaphragms are illustrated in FIGS. 19, 20 and 21. However, the use of diaphragms results in a loss of light, which is generally undesirable. There is likewise the possibility of setting the desired illumination setting virtually in a lossless manner by a diversion of the beam paths for example using a multi-mirror array. By way of example, the illumination mirrors 9 and 10 of the illumination system 1 illustrated in FIG. 2 can be used for this purpose.

FIGS. 19, 20 and 21 show schematic illustrations of different exemplary embodiments of diaphragms 53 for generating illumination settings. The diaphragms 53 can be embodied as thin metal disks, for example. In the exemplary embodiments illustrated, the diaphragms 53 are in each case embodied as circular disks and have diaphragm openings 54, 55 or inner diaphragm openings 54a, 55a and outer diaphragm openings 54b, 55b, which allow the light of the illumination system 1 to pass through. Outside the diaphragm openings 54, 55 or the inner diaphragm openings 54a, 55a and the outer diaphragm openings 54b, 55b, the diaphragms 53 of the illumination system 1 are opaque.

The illumination setting in accordance with FIG. 8 can be set with the exemplary embodiment of the diaphragm 53 as illustrated in FIG. 19. Accordingly, the form and arrangement of the diaphragm openings 54, 55 correspond to the form and arrangement of the illumination poles 35 and 36 as illustrated in FIG. 8. In this case, the diaphragm openings 54, 55 are distinguished, in particular, by the fact that their boundaries in each case have in regions a form corresponding to the form of the outer contour of the obscuration, that is to say the form of the inner circle 34. In particular, the boundaries of the diaphragm openings 54, 55 are embodied such that in regions they are identical to the outer contour of the obscuration. In the exemplary embodiment illustrated, such correspondence in regions exists both with regard to the boundaries radially inward and with regard to the boundaries radially outward.

The exemplary embodiment of the diaphragm 53 as illustrated in FIG. 20 serves for setting the illumination setting in accordance with FIG. 12. Accordingly, the diaphragm 53 has inner diaphragm openings 54a, 55a and outer diaphragms openings 54b, 55b, the form and arrangement of which correspond to the form and arrangement of the illumination poles 35a, 36a, 35b, 36b as illustrated in FIG. 12. In this case, the outer diaphragm openings 54b, 55b are arranged completely radially outside the inner diaphragm openings 54a, 55a. Furthermore, the inner diaphragm openings 54a, 55a each have a form corresponding to the form of the outer contour of the obscuration. In the exemplary embodiment illustrated, the boundaries of the inner diaphragm openings 54a, 55a radially inward in each case have a form corresponding to the form of the outer contour of the obscuration. In particular, the boundaries of the inner diaphragm openings 54a, 55a radially inward are in each case embodied identically to the outer contour of the obscuration.

The exemplary embodiment of the diaphragm 53 as illustrated in FIG. 21 serves for setting the illumination setting in accordance with FIG. 17. Accordingly, the form and arrangement of the diaphragm openings 54, 55 correspond to the form and arrangement of the illumination poles 35 and 36 as illustrated in FIG. 17. In particular, the diaphragm 53 has, within the diaphragm openings 54, 55, opaque regions 56, 57 which are fixed via thin webs 58, 59 and correspond to the dark zones 41, 42 of the illumination setting in terms of form and arrangement. Accordingly, the opaque regions 56, 57 form boundaries of the diaphragm openings 54, 55 whose form corresponds in regions to the form of the outer contour of the obscuration. In particular, these boundaries of the diaphragm openings 54, 55 are embodied such that in regions they are identical to the outer contour of the obscuration. In the exemplary embodiment illustrated, the correspondence in regions exists in each case on the radially inwardly directed side of the opaque regions 56, 57.

For reasons of clarity, unless respectively stated otherwise, a mask 3 having vertical strips was respectively taken as a basis for the above description and the figures. The considerations apply analogously in each case for horizontally extending strip patterns or for other diffracting structures of the pattern.

1 Illumination system
2 Projection objective
3 Mask
4 Object plane
5 Substrate
6 Image plane
7 Light source
8 First illumination mirror
9 Second illumination mirror
10 Third illumination mirror
11 Fourth illumination mirror
12 Fifth illumination mirror
13 Mirror facet
14 Mirror facet
15 First imaging mirror
16 Second imaging mirror
17 Third imaging mirror
18 Fourth imaging mirror
19 Fifth imaging mirror
20 Sixth imaging mirror
21 Seventh imaging mirror
22 Eighth imaging mirror
23 Optical system axis
24 Cutout
25 Cutout
26 Cutout
27 Cutout
28 First intermediate image plane
29 Second intermediate image plane
30 First pupil plane
31 Second pupil plane
32 Third pupil plane
33 Outer circle
34 Inner circle
35 Illumination pole
35a Inner illumination pole
35b Outer illumination pole
36 Illumination pole
36a Inner illumination pole
36b Outer illumination pole
37, 37a, 37b Region illuminated by $0^{th}$ diffraction order
38, 38a, 38b Region illuminated by $0^{th}$ diffraction order
39, 39a, 39b Region illuminated by $+1^{st}$ diffraction order
40, 40a, 40b Region illuminated by $-1^{st}$ diffraction order
41 Dark zone
42 Dark zone
43 Unilluminated zones
44 Unilluminated zones
45 Pupil region
46 Pupil region
47 Pupil region
48 Pupil region
49 Pupil region
50 Pupil region
51 Pupil region
52 Pupil region
53 Diaphragm
54 Diaphragm opening
54a Inner diaphragm opening
54b Outer diaphragm opening
55 Diaphragm opening
55a Inner diaphragm opening
55b Outer diaphragm opening
56 Opaque region
57 Opaque region
58 Web
59 Web

What is claimed is:

1. An apparatus, comprising:
   an illumination system configured to illuminate a pattern; and
   a projection objective configured to image the pattern onto a light-sensitive material,
   wherein:
   the projection objective has a pupil plane with an obscuration;
   the illumination system generates light with an angular distribution having an outer illumination pole which extends over a range of polar angles and a range of azimuth angles and within which the light intensity is greater than an outer illumination pole minimum value;
   the angular distribution has an inner illumination pole which extends over a range of polar angles and a range of azimuth angles and within which the light intensity is greater than an inner illumination pole minimum value;
   the angular range of the inner illumination pole has smaller polar angles than the angular range of the outer illumination pole;
   the inner illumination pole minimum value is greater than the outer illumination pole minimum value; and
   the apparatus is a projection exposure apparatus for EUV microlithography.

2. The apparatus of claim 1, wherein the angular distribution of the light between the outer illumination pole and the inner illumination pole has a range of polar angles within which the light intensity is less than the outer illumination pole minimum value and less than the inner illumination pole minimum value.

3. The apparatus of claim 1, wherein the outer illumination pole has a larger area than the inner illumination pole.

4. The apparatus of claim 1, wherein the outer illumination pole and the inner illumination pole extend over the same range of azimuth angles.

5. The apparatus of claim 1, comprising a mirror arrangement configured to form the illumination pole.

6. The apparatus of claim 1, wherein the illumination pole extends over a range of azimuth angles of at least 45°.

7. The apparatus of claim 1, wherein the angular distribution of the light has a further illumination pole which is embodied analogously to the illumination pole.

8. The apparatus of claim 1, wherein the obscuration is arranged centrally in the pupil plane.

9. The apparatus of claim 1, wherein the projection objective has an image-side numerical aperture of at least 0.4.

10. An apparatus, comprising:
    an illumination system configured to illuminate a pattern; and
    a projection objective configured to image the pattern onto a light-sensitive material,
    wherein:
        the projection objective has a pupil plane with an obscuration;
        the illumination system generates light with an angular distribution having an illumination pole which extends over a range of polar angles and a range of azimuth angles and within which the light intensity is greater than an illumination pole minimum value;
        from the illumination pole toward large polar angles, a dark zone is excluded within which the light intensity is less than the illumination pole minimum value, and which has in regions a form corresponding to the form of the obscuration of the pupil plane; and
        the apparatus is a projection exposure apparatus for EUV microlithography.

11. The apparatus of claim 10, wherein the dark zone is enclosed in regions by the illumination pole.

12. The apparatus of claim 10, wherein the dark zone is enclosed completely by the illumination pole.

13. The apparatus according to claim 10, wherein the illumination pole is concave toward large polar angles at least within an azimuth angle range.

14. The apparatus of claim 10, wherein the outer contour of the dark zone is embodied identically to the outer contour of the obscuration at least in regions.

15. An apparatus, comprising:
    an illumination system configured to illuminate a pattern; and
    a projection objective configured to image the pattern onto a light-sensitive material,
    wherein:
        the projection objective has a pupil plane with an obscuration;
        the illumination system generates light with an angular distribution having an illumination pole which extends over a range of polar angles and a range of azimuth angles and within which the light intensity is greater than an illumination pole minimum value;
        the light intensity within the illumination pole increases from large polar angles toward small polar angles; and
        the apparatus is a projection exposure apparatus for EUV microlithography.

16. The apparatus of claim 15, wherein the illumination pole extends toward small polar angles so that there are polar angles with sine values of less than 110% of the sine values of the polar angles at an edge of the obscuration.

17. The apparatus of claim 15, wherein the illumination pole extends toward large polar angles so that there are polar angles with sine values of at least 90% of the object-side numerical aperture of the projection objective.

18. A method, comprising:
    using an illumination system to generate light in the EUV range with an angular distribution having an illumination pole which extends over a range of polar angles and a range of azimuth angles and within which the light intensity is greater than an illumination pole minimum value, the illumination pole being embodied so that, toward large polar angles, a dark zone is excluded within which the light intensity is less than the illumination pole minimum value, and which has in regions a form corresponding to the form of the obscuration of the pupil plane; and
    using a projection objective with a pupil plane with an obscuration to expose a light-sensitive material to the EUV radiation.

19. A method, comprising:
    using an illumination system to generate light in the EUV range with an angular distribution having an outer illumination pole which extends over a range of polar angles and a range of azimuth angles and within which the light intensity is greater than an outer illumination pole minimum value, the angular distribution having an inner illumination pole which extends over a range of polar angles and a range of azimuth angles and within which the light intensity is greater than an inner illumination pole minimum value, the angular range of the inner illumination pole having smaller polar angles than the angular range of the outer illumination pole, and the inner illumination pole minimum value of the light intensity is greater than the outer illumination pole minimum value; and
    using a projection objective having a pupil plane with an obscuration to expose a light-sensitive material to the EUV radiation.

20. A method, comprising:
    using an illumination system to generate light in the EUV range with an angular distribution having an illumination pole which extends over a range of polar angles and a range of azimuth angles and within which the light intensity is greater than an illumination pole minimum value, the illumination pole being embodied so that the light intensity within the illumination pole increases from large polar angles toward small polar angles; and
    using a projection objective having a pupil plane with an obscuration to expose a light-sensitive material to the EUV radiation.

21. A diaphragm of an illumination system of a projection exposure apparatus for EUV microlithography, the diaphragm having a diaphragm opening configured to predetermine an angular distribution of light which is generated by the illumination system and fed to a projection objective having a pupil plane with an obscuration, and the diaphragm opening being delimited by a boundary having in regions a form corresponding to a form of an outer contour of the obscuration of the pupil plane of the projection objective.

22. The diaphragm of claim 21, wherein a region of the boundary of the diaphragm opening whose form corresponds to the form of the outer contour of the obscuration of the pupil plane of the projection objective delimits the diaphragm opening radially toward the outside.

23. A diaphragm of an illumination system of a projection exposure apparatus for EUV microlithography, the diaphragm having an inner diaphragm opening and an outer diaphragm opening configured to predetermine an angular distribution of light which is generated by the illumination system and fed to a projection objective having a pupil plane with an obscuration, and the outer diaphragm opening being completely radially outside the inner diaphragm opening.

24. The diaphragm of claim 23, wherein the inner diaphragm opening is limited by at least one boundary having in regions a form corresponding to the form of the outer contour of the obscuration of the pupil plane of the projection objective.

* * * * *